(12) United States Patent
Nagamura et al.

(10) Patent No.: US 6,209,553 B1
(45) Date of Patent: Apr. 3, 2001

(54) METHOD OF AND APPARATUS FOR WASHING PHOTOMASK AND WASHING SOLUTION FOR PHOTOMASK

(75) Inventors: Yoshikazu Nagamura; Nobuyuki Yoshioka, both of Hyogo; Koji Yamanaka; Masaki Kusuhara, both of Tokyo, all of (JP)

(73) Assignees: MitsubishiDenki Kabushiki Kaisha; Organo Corporation; M. Watanabe & Co., Ltd., all of Tokyo (JP)

( * ) Notice: Subject to any disclaimer, the term of this patent is extended or adjusted under 35 U.S.C. 154(b) by 0 days.

(21) Appl. No.: 09/504,728

(22) Filed: Feb. 16, 2000

(30) Foreign Application Priority Data

May 20, 1999 (JP) .................................................. 11-139793

(51) Int. Cl.⁷ ...................................................... B08B 3/02
(52) U.S. Cl. ...................... 134/56 R; 134/113; 134/902; 134/102.1; 134/102.2
(58) Field of Search ................................ 134/56 R, 57 R, 134/58 R, 61, 76, 84, 88, 102.1, 102.3, 113, 902, 102.2

(56) References Cited

U.S. PATENT DOCUMENTS

| | | | |
|---|---|---|---|
| 5,073,268 | * | 12/1991 | Saito et al. . |
| 5,722,441 | * | 3/1998 | Teramoto ............................ 134/902 |
| 5,979,474 | * | 11/1999 | Manako ............................. 134/102.1 |
| 6,035,871 | * | 3/2000 | Eui-Yeol ................................ 134/61 |
| 6,039,055 | * | 3/2000 | Akatsu ................................. 134/902 |
| 6,039,815 | * | 3/2000 | Yeol et al. . |
| 6,086,057 | * | 7/2000 | Mitsumori . |

FOREIGN PATENT DOCUMENTS

| | | | |
|---|---|---|---|
| 4-27123 | * | 1/1992 | (JP) . |
| 4-207031 | * | 7/1992 | (JP) . |
| 4-278529 | * | 10/1992 | (JP) . |
| 5-102116 | * | 4/1993 | (JP) . |
| 5-109683 | * | 4/1993 | (JP) . |
| 5-144787 | * | 6/1993 | (JP) . |
| 5-166777 | * | 7/1993 | (JP) . |
| 5-166778 | * | 7/1993 | (JP) . |
| 8-126873 | | 5/1996 | (JP) . |
| 9-19661 | | 1/1997 | (JP) . |
| 10-64867 | | 3/1998 | (JP) . |
| 10-172941 | | 6/1998 | (JP) . |

* cited by examiner

Primary Examiner—Frankie L. Stinson
(74) Attorney, Agent, or Firm—McDermott, Will & Emery

(57) ABSTRACT

Organic matter and metal impurities present on the surface of a photomask are removed. Foreign matter still adhering to the surface of the photomask is removed with $H_2$ gas dissolved water. The photomask is dried. Thus provided is a method of washing a photomask in a manner which permits attaining an effect of removing foreign matter equivalent or superior to that of a conventional method with a small amount of chemical solution and reducing the amounts of chemicals and high purity water.

4 Claims, 6 Drawing Sheets

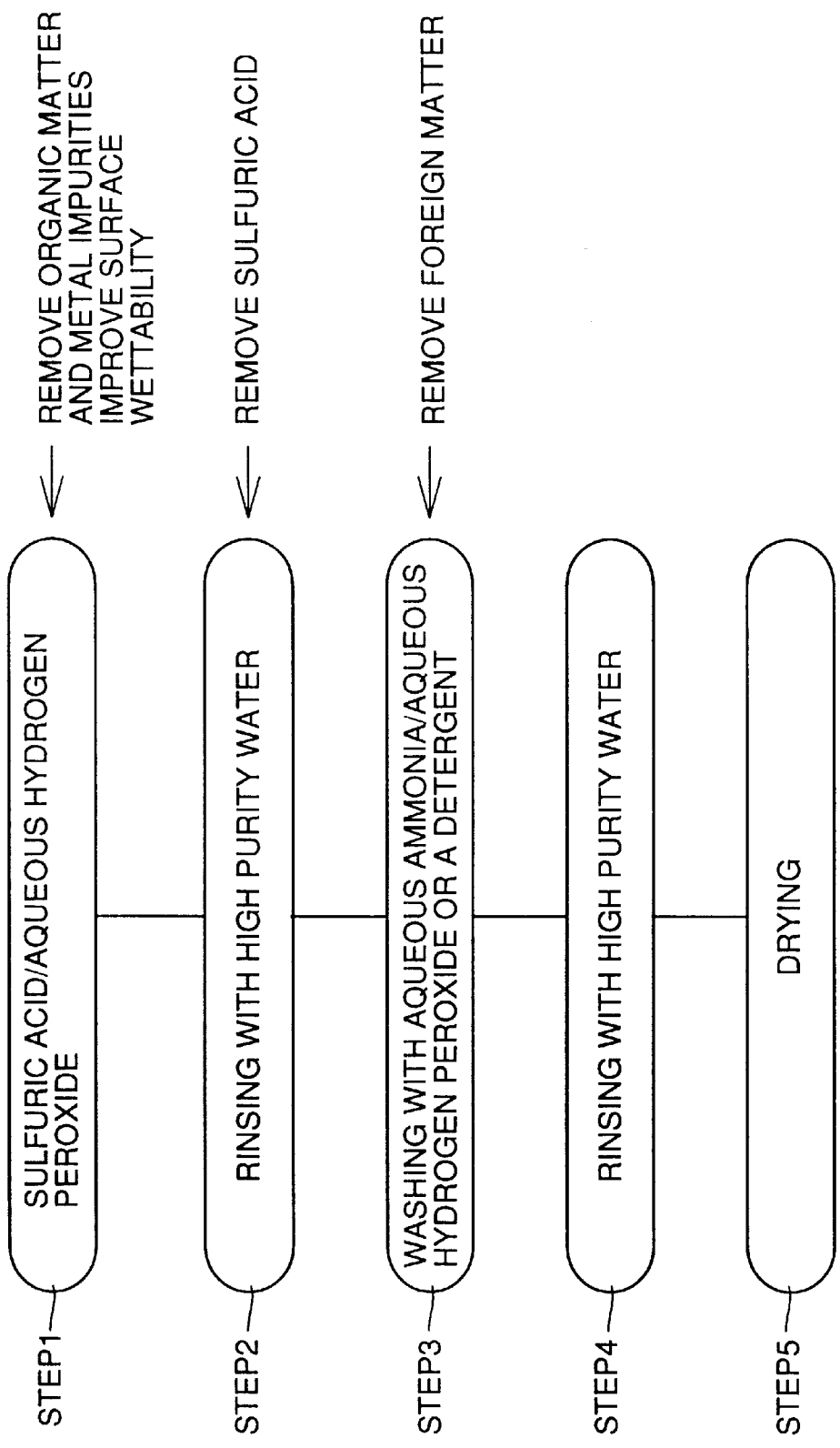

METHOD OF AND APPARATUS FOR WASHING PHOTOMASK AND WASHING SOLUTION FOR PHOTOMASK

BACKGROUND OF THE INVENTION

1. Field of the Invention

The present invention generally relates to a method of washing a photomask used as an original plate in a photolithography step for fabricating a semiconductor device (LSI), and more particularly, it relates to an improved method of washing a photomask in an improved manner which permits obtaining a extremely dean surface. The present invention also relates to an apparatus for washing a photomask in an improved manner which permits obtaining a extremely clean surface. The present invention further relates to a washing solution capable of obtaining such a photomask having an extremely clean surface.

2. Description of the Prior Art

A photomask is used as an original plate when transferring the pattern of an integrated circuit onto a surface of a wafer with a transfer unit in a photolithography step for fabricating a semiconductor device. If the pattern formed on a surface of the photomask is defective or the photomask is foul with foreign matter exceeding the resolution limit, the defect or the foreign matter is disadvantageously transferred onto the wafer as part of the pattern. Therefore, no defect or foreign matter exceeding the resolution limit is allowed on the surface of the photomask. Due to high integration and refinement of the integrated circuit, the size of allowable defect or foreign matter is limited to not more than 0.5 μm.

In general, such a photomask is washed by a method based on RCA washing, employing a mixed solution of acid such as sulfuric acid and aqueous hydrogen peroxide and a mixed solution of an alkaline chemical solution such as aqueous ammonia and aqueous hydrogen peroxide, which has been field-proven in a wafer washing step.

FIG. 11 illustrates the flow of the conventional washing process.

In a step 1, the photomask is washed with a high-temperature mixed solution of sulfuric acid and aqueous hydrogen peroxide, in order to decompose organic matter such as resist or a solvent present on the surface of the photomask and remove metal impurities. The wettability of the mask surface is improved through this step to improve the efficiency of later washing.

Then, in a step 2, the photomask is rinsed with high purity water for removing chemicals such as sulfuric acid Then, in a step 3, the photomask is dipped in a tank and washed in a heated mixed solution of ammonia and aqueous hydrogen peroxide, in order to remove foreign matter adhering to the photomask. At this time, ultrasonic waves such as megasonic waves may be applied to the dipping tank.

Also after the step 3, the photomask must be sufficiently rinsed with high purity water in a step 4. Finally, the photomask rinsed with high purity water is dried in a step 5. At the step 3, the photomask may be washed not with the mixed solution of ammonia and aqueous hydrogen peroxide but with only high purity water or high purity water mixed with a detergent, with application of ultrasonic waves such as megasonic waves.

In the aforementioned dipping system, the throughput can be improved by simultaneously dipping a plurality of photomasks in one tank, while a remarkably contaminated photomask may disadvantageously contaminate other relatively clean photomasks.

In order to improve this point, a spin washing method of horizontally rotating a photomask and applying a chemical solution, high purity water or the like thereto from a fixed or swinging nozzle is performed as a system throwing away the chemical solution for washing a single photomask. In the spin system, the photomask may be subjected to mechanical washing such as high-pressure high purity water jet rinsing, megasonic high purity water rinsing or the like for further effectively removing foreign matter.

The aforementioned step 3 of treating the photomask with aqueous ammonia/aqueous hydrogen peroxide for removing foreign matter has the following problem: In the dip washing, a plurality of photomasks are treated with the same chemical solution, and hence the chemical solution must be frequently renewed to avoid its deterioration or contamination, leading to increase of the amount of the chemical solution consumed. If the washing efficiency (washing yield) is inferior, each photomask is washed a plurality of times, to result in increase of the amounts of chemicals or high purity water and energy such as electricity.

A phase-shift photomask improving the resolution of resist on a wafer by partially shifting the phase of light transmitted through the photomask has recently been developed and put into practice. An MoSiON film is used as a material of a shading mask for a halftone photomask, which is a kind of such phase-shift photomask.

However, the transmittance and the phase angle of the MoSiON film remarkably fluctuate through washing with an alkaline chemical such as the conventional dipping in aqueous ammonia/aqueous hydrogen peroxide. Thus, the MoSiON film cannot keep its quality when the photomask is shipped as a product. Therefore, washing with aqueous ammonia/aqueous hydrogen peroxide effective for removing foreign matter cannot be applied to the MoSiON film, which is in practice washed with only high purity water or a detergent. Thus, foreign matter disadvantageously remains on the MoSiON film.

SUMMARY OF THE INVENTION

The present invention has been proposed in order to solve the aforementioned problem, and an object thereof is to provide a method of washing a photomask in an improved manner which permits attaining an effect of removing foreign matter equivalent or superior to that of the conventional method with a small amount of chemical solution and reducing the amounts of chemicals and high purity water consumed.

Another object of the present invention is to provide a method of washing a photomask in an improved manner which permits effectively removing foreign matter without changing the transmittance etc. of a shading film (MoSiON film) of a phase-shift photomask.

Still another object of the present invention is to provide a washing apparatus capable of implementing such a washing method.

A further object of the present invention is to provide a washing solution for a photomask capable of implementing such a method of washing a photomask.

In a method of washing a photomask according to a first aspect of the present invention, organic matter and metal impurities present on a surface of a photomask are first removed. Foreign matter adhering to the surface of the photomask is removed with $H_2$ gas dissolved water. The photomask is dried.

According to this method, the $H_2$ gas dissolved water is so employed as to remove the foreign matter at a high removal ratio.

In a method of washing a photomask according to a second aspect of the present invention, the $H_2$ gas dissolved water is alkalized. Thus, the foreign matter is removed at a higher removal ratio.

In a method of washing a photomask according to a third aspect of the present invention, the $H_2$ gas dissolved water is alkalized with ammonia.

According to this method, the $H_2$ gas dissolved water contains ammonia, whereby the foreign matter is removed at a higher removal ratio.

In a method of washing a photomask according to a fourth aspect of the present invention, the $H_2$ gas dissolved water is alkalized with a small amount of KOH. Thus, the foreign matter is removed at a higher removal ratio.

In a method of washing a photomask according to a fifth aspect of the present invention, ultrasonics waves are also employed in the step of removing foreign matter.

According to this method, that particulate foreign matter adhering to the surface of the photomask can be effectively removed by also employing ultrasonics waves.

In a method of washing a photomask according to a sixth aspect of the present invention, ultrasonics waves are also employed also in the first step of removing organic matter and metal impurities. The organic matter and metal impurities are further efficiently removed due to the employment of ultrasonics waves.

In a method of washing a photomask according to a seventh aspect of the present invention, the foreign matter is particulate foreign matter. Such particulate foreign matter can be readily physically removed by ultrasonics waves.

An apparatus for washing a photomask according to an eighth aspect of the present invention comprises an acid tank for removing organic matter and metal impurities present on the surface of a photomask with a first washing solution. The washing apparatus also comprises a foreign matter removing tank for removing foreign matter adhering to the surface of the photomask with a second washing solution containing $H_2$ gas dissolved water. The washing apparatus further comprises a drying tank for drying the photomask. The washing apparatus further comprises a first washing solution supply unit supplying the first washing solution to the acid tank and a second washing solution supply unit supplying the second washing solution to the foreign matter removing tank. The first washing solution supply unit is provided with a first control unit for controlling the concentration and the temperature of the first washing solution. The second washing solution supply unit is provided with a second control unit controlling the concentration and the temperature of the second washing solution.

The foreign matter adhering to the surface of the photomask is removed with the washing solution containing $H_2$ gas dissolved water.

Thus, the foreign matter can be removed from the mask at a high removal ratio.

In an apparatus for washing a photomask according to a ninth aspect of the present invention, the foreign matter removing tank is provided with a ultrasonics unit giving off ultrasonic waves into the foreign matter removing tank.

By use of this apparatus, the photomask can be treated with ultrasonic waves, whereby particulate foreign matter can be effectively removed.

In an apparatus for washing a photomask according to a tenth aspect of the present invention, the acid tank is provided with a ultrasonics unit giving off ultrasonic waves into the acid tank.

By use of this apparatus, ultrasonic waves are sent also into the acid tank, whereby the washing efficiency is improved.

In an apparatus for washing a photomask according to an eleventh aspect of the present invention, the foreign matter removing tank is further provided with an aqueous ammonia supply unit supplying aqueous ammonia of prescribed concentration into the foreign matter removing tank.

By use of this apparatus, ammonia can be supplied into the foreign matter removing tank, whereby foreign matter can be effectively removed.

A washing solution for a photomask according to a twelfth aspect of the present invention contains $H_2$ gas dissolved water. Thus, foreign matter can be effectively removed.

In a washing solution for a photomask according to a thirteenth aspect of the present invention, the $H_2$ gas dissolved water is alkalized. Thus, a removal ratio is further improved.

In a washing solution for a photomask according to a fourteenth aspect of the present invention, the $H_2$ gas dissolved water is alkalized with ammonia.

Since the $H_2$ gas dissolved water is alkalized with ammonia, the washing effect can be improved with even extremely low concentration of ammonia.

A method according to a fifteenth aspect of the present invention relates to a method of washing a halftone phase-shift photomask formed with an MoSiON film. According to this method, foreign matter is washed out with $H_2$ gas dissolved water, whereby variations in the transmittance of the MoSiON can be suppressed below a maximum allowable limit and the washing efficiency can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 illustrates the flow of a conventional mask washing process.

DESCRIPTION OF THE PREFERRED EMBODIMENTS

Embodiments of the present invention are now described with reference to the drawings.

First Embodiment

Figure 1:
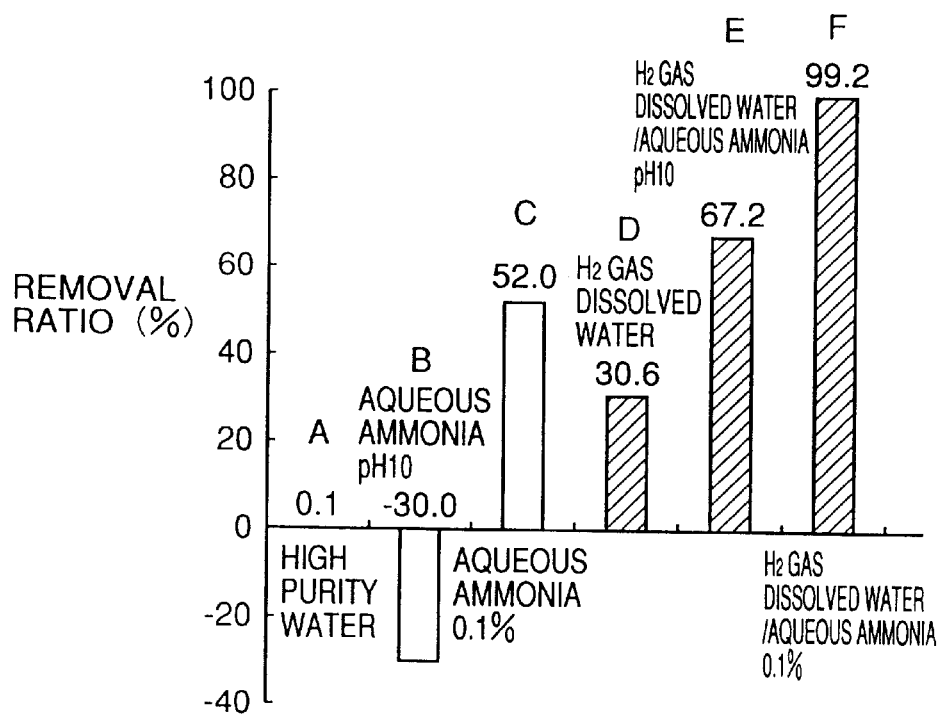
FIG. 1 is a graph showing removal ratios for silica grains on a CrON film after treatment with various types of chemical solutions.

With reference to a first embodiment of the present invention, a method of effectively removing fine dust, metal, organic matter and the like adhering to a surface of a photomask in fabrication steps is described. Silica ($SiO_2$) grains were deposited as foreign matter to the surface of a photomask formed with a CrON film as a shading film. The photomask was dipped in various types of chemical solutions in an overflow tank 301 made of quartz shown in FIG. 2, and subjected to megasonic irradiation through an ultrasonic oscillator 302. FIG. 1 shows removal ratios for the silica grains on the CrON film after treatment with the chemical solutions.

As shown in FIG. 1, an experiment was made with chemical solutions A (high purity water), B (diluted aqueous ammonia (pH 10)), C (aqueous ammonia of 0.1% in concentration), D ($H_2$ gas dissolved water), E ($H_2$ gas dissolved water mixed with a small amount of aqueous ammonia so that the pH was about 10) and F ($H_2$ gas dissolved water mixed with 0.1% of ammonia) and foreign matter removal ratios were determined. The $H_2$ gas dissolved water is high purity water in which $H_2$ gas is dissolved, and a method of forming the $H_2$ gas dissolved water is described later.

The $H_2$ gas dissolved water employed in this experiment was prepared by electrolyzing high purity water so that $H_2$ gas formed on the cathode side was dissolved in the high purity water, and the concentration of the $H_2$ gas was about 1.3 ppm. The removal ratio is expressed in the ratio of the number of grains removed by the treatment to the number of grains present before the treatment.

As clearly understood from FIG. 1, the removal ratios with the high purity water and the diluted aqueous ammonia (pH 10) were 0.1% and 30% respectively, and the silica grains employed as foreign matter were hardly removed. In the case of $H_2$ gas dissolved water, the silica grains were removed in a removal ratio of about 30%. In the case of $H_2$ gas dissolved water mixed with an extremely small amount of aqueous ammonia so that the hydrogen ion concentration (pH) was about 10, the removal ratio was improved to about 65%. In the case of $H_2$ gas dissolved water mixed with about 1% of aqueous ammonia, the silica grains were removed with a high removal ratio of 99%. In the case of the water in which ammonia of 0.1% in concentration was dissolved, the removal ratio was 52% (see graph C).

Thus, when mega-ultrasonic waves treatment is carried out in high purity water ($H_2$ gas dissolved water) in which $H_2$ gas is dissolved, particulate foreign matter adhering to the surface of the photomask can be effectively removed. Further, it has been proved that removal efficiency for the foreign matter adhering to the surface of the photomask can be remarkably improved by employing $H_2$ gas dissolved water mixed with a small amount of ammonia.

The concentration of ammonia used for the chemical solution having hydrogen ion concentration (pH) of about 10 is about 0.003%, and the washing effect of the $H_2$ gas dissolved water can be improved with such low concentration of ammonia. Thus, the amount of the chemical solution can be remarkably reduced as compared with the conventional washing method. As compared with a case of using a concentrated chemical solution, the amount of high purity water used for rinsing the photomask after the washing treatment can be remarkably reduced. Further, the washing time can be reduced due to the improvement of the washing ability, thereby saving energy such as electricity.

Figure 3:
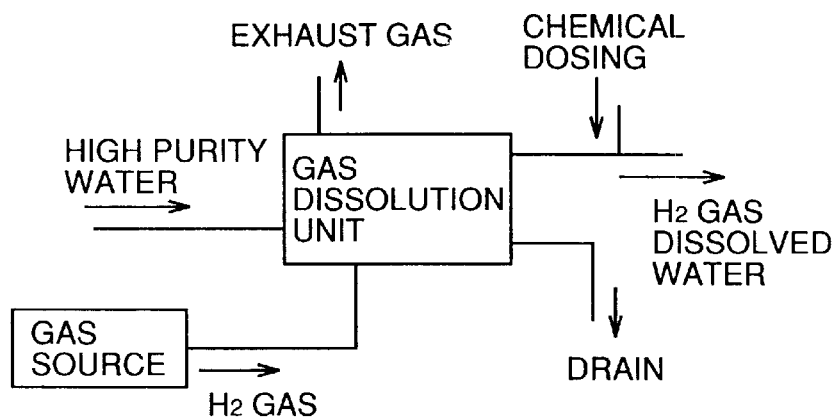
FIG. 3 is a conceptual diagram of a process for forming $H_2$ gas dissolved water.

FIG. 3 shows a method of forming $H_2$ gas dissolved water. $H_2$ gas is directly supplied from a gas cylinder or generated by electrolyzing water, and dissolved in high purity water in a gas dissolution unit. The gas is dissolved by a method of supplying the gas and high purity water into a stirrer with a pump, generating a number of bubbles in the water and stirring the same or a method of dissolving the gas in high purity water through a gas permeation film. The hydrogen ion concentration can be changed by adding a chemical solution such as diluted aqueous ammonia to the $H_2$ gas dissolved water formed by such a method.

Second Embodiment

With reference to a second embodiment of the present invention, a washing method optimum for removing foreign matter from a phase-shift photomask such as a halftone photomask is described.

A shading film for a halftone mask is formed by an MoSiON film. A glass substrate formed with such an MoSiON film of about 0.1 μm was dipped in various types of washing solutions for two hours, to determine variations (%) in the transmittance at a wavelength of 246 nm.

Figure 4:
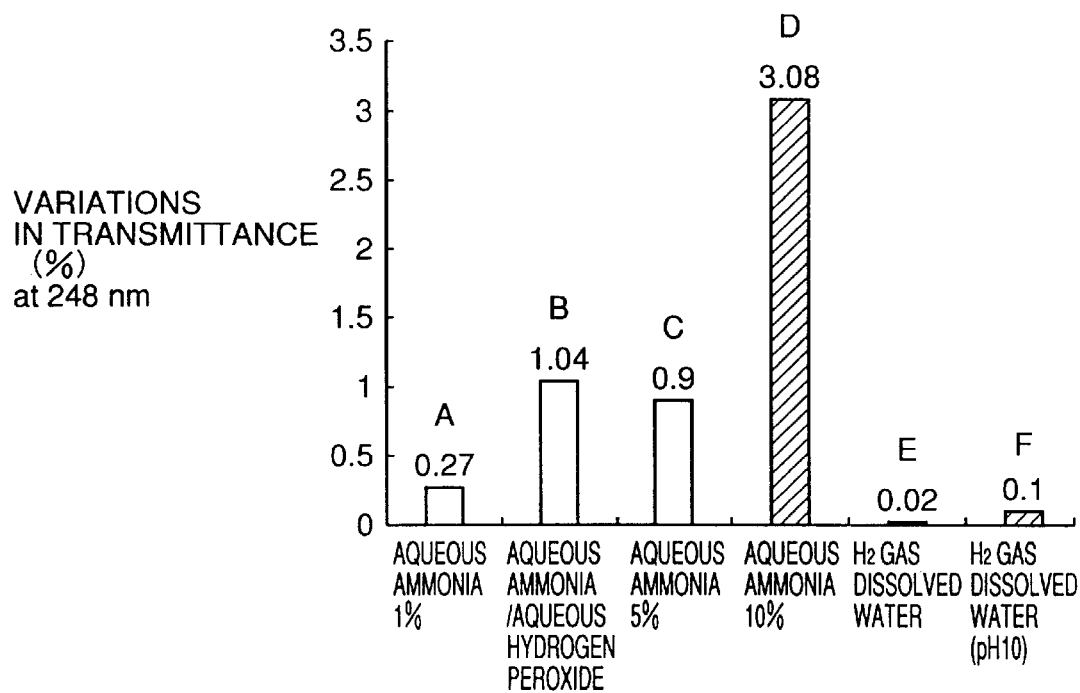
FIG. 4 is a graph showing variations in the transmittance of an MoSiON film after alkali treatment.

FIG. 4 illustrates the variations in the transmittance after washing. An experiment was made with washing solutions A (aqueous ammonia of 1% concentration), B (aqueous ammonia/aqueous hydrogen peroxide), C (aqueous ammonia of 5% concentration), D (aqueous ammonia of 10% concentration), E ($H_2$ gas dissolved water) and F ($H_2$ gas dissolved water mixed with a small amount of aqueous ammonia (pH 10)), as shown in FIG. 4.

Through treatment with the aqueous ammonia/aqueous hydrogen peroxide (B) used in conventional photomask washing for removing foreign matter, the transmittance was increased by about 1.04%. In the high purity water (C) having the ammonia concentration of 5% and the high purity water (A) having the ammonia concentration of 1%, the transmittance was increased by 0.9% and 0.27% respectively. In the $H_2$ gas dissolved water (E) and the $H_2$ gas dissolved water (F) of pH 10 mixed with a small amount of aqueous ammonia, however, the transmittance was increased by only 0.02% and 0.1% respectively.

When the transmittance of an MoSiON film formed on the surface of a photomask as a shading film varies, the shape and dimensions of a resist circuit pattern transferred onto a wafer vary to finally deteriorate the characteristics of an LSI. Therefore, the transmittance of the MoSiON film is strictly managed. The conventional treatment with aqueous ammonia/aqueous hydrogen peroxide cannot be employed for washing a photomask formed with an MoSiON film, due to remarkable variation in the transmittance. However, the fluctuation of the transmittance in the $H_2$ gas dissolved water and the $H_2$ gas dissolved water of pH 10 mixed with a small amount of ammonia shown in FIG. 4 is allowable.

Figure 5:
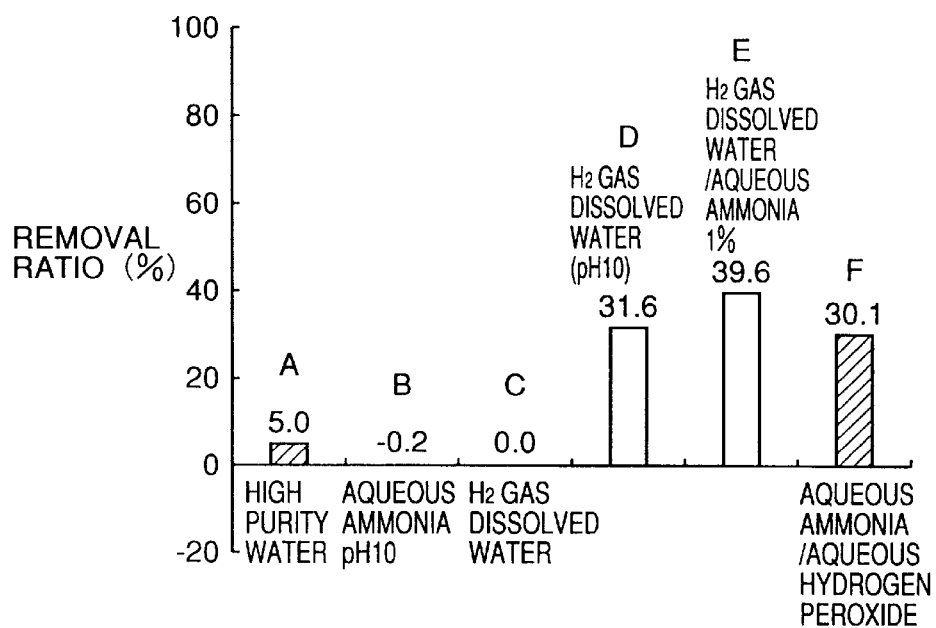
FIG. 5 is a graph showing removal ratios for alumina grains on an MoSiON film after treatment with various types of chemical solutions.

FIG. 5 shows removal ratios for alumina ($Al_2O_3$) grains subjected to megasonic irradiation in various types of solutions. The alumina ($Al_2O_3$) grains were deposited onto the MoSiON film as foreign matter.

The removal ratio was obtained by dividing the number of grains removed through megasonic irradiation by the number of grains present before the treatment. An experiment was made with solutions A (high purity water), B (diluted aqueous ammonia of pH 10), C ($H_2$ gas dissolved water), D ($H_2$ gas dissolved water of pH 10 mixed with a small amount of aqueous ammonia), E ($H_2$ gas dissolved water having ammonia concentration of 1%) and F (aqueous ammonia/aqueous hydrogen peroxide), as shown in FIG. 5.

As a result, the following were proved: In the high purity water (A), the dilute aqueous ammonia (B) and the $H_2$ gas dissolved water (C), the removal ratios were 5.0%, −0.2% and 0.0% respectively, and the alumina grains were hardly removed. In the $H_2$ gas dissolved water mixed with a small amount of aqueous ammonia (D), however, the alumina grains were removed with a removal ratio of 31.6%. In the catholyte of 1% ammonia concentration (E) prepared by further increasing the amount of aqueous ammonia, the alumina grains were removed with a removal ratio of 39.6%. In the generally employed aqueous ammonia/aqueous hydrogen peroxide (F) effective for removing foreign matter, the removal ratio was 31%. Thus, it has been proved that the $H_2$ gas dissolved water (D) mixed with a small amount of aqueous ammonia attains an effect of removing foreign matter equivalent to that of the aqueous ammonia/aqueous hydrogen peroxide (F).

In other words, it has been proved from the results shown in FIGS. 4 and 5 that a washing effect equivalent or superior to that of the prior art can be attained without varying the transmittance of the MoSiON film by washing out foreign matter with $H_2$ gas dissolved water mixed with a small amount of ammonia of 0.003% concentration. If the ammonia concentration is not more than 1%, the variation in the transmittance can be suppressed below the management criteria (e.g., 0.5%) while improving the washing efficiency by limiting the washing treatment to a short time.

Third Embodiment

In the first and second embodiments, aqueous ammonia was added to $H_2$ gas dissolved water. In a third embodiment of the present invention, a chemical solution rendered slightly alkaline by adding a small amount of electrolyte such as KOH in place of aqueous ammonia was employed. A similar effect can be attained also in this case.

Fourth Embodiment

Figure 2:
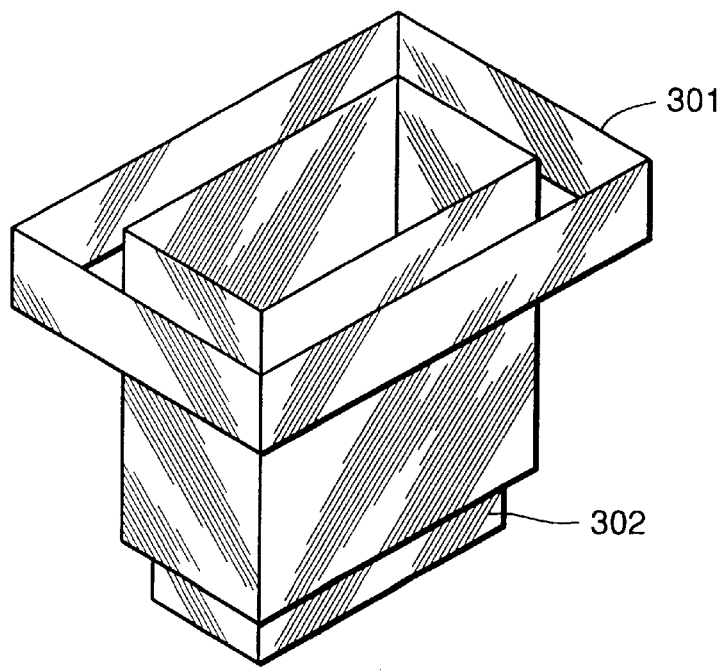
FIG. 2 is a conceptual diagram of an overflow tank provided with an ultrasonic oscillator.

The effects described with reference to the first and second embodiments can be attained by dipping a photomask substrate in $H_2$ gas dissolved water or $H_2$ gas dissolved water mixed with a small amount of aqueous ammonia introduced into a conventional overflow tank, as shown in FIG. 2. The washing effect is further improved by applying ultrasonic waves.

Fifth Embodiment

The overall steps of washing a photomask are described with reference to a fifth embodiment of the present invention.

Figure 6:
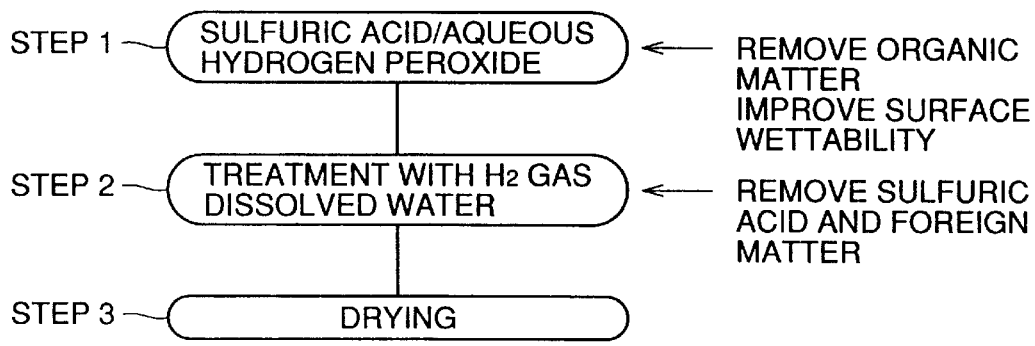
FIG. 6 is a conceptual diagram of the flow of a photomask washing process.

FIG. 6 illustrates the flow of a high-performance washing process according to the present invention. In a step 1, a photomask is washed with a high-temperature mixed solution of sulfuric acid and aqueous hydrogen peroxide, in order to decompose organic matter such as resist and a solvent present on the surface of the photomask, improve the wettability of the surface and remove metal impurities. In a step 2, the photomask is subjected to washing for removing sulfuric acid remaining on the surface of the photomask and foreign matter adhering thereto.

If a shading film formed on the washed photomask is a CrON film, the photomask is subjected to mega-ultrasonic waves in $H_2$ gas dissolved water or $H_2$ gas dissolved water mixed with a small amount of ammonia as described with reference to the first embodiment, for removing particulate foreign matter adhering to the surface of the photomask.

The concentration of the ammonia used for the $H_2$ gas dissolved water is about 0.003% when the pH of the $H_2$ gas dissolved water is 10. The washing effect can be improved with such extremely low concentration of ammonia, whereby the amount of the chemical solution (ammonia) can be remarkably reduced as compared with the conventional washing method. As compared with a case of using a concentrated chemical solution, further, the amount of high purity water used for rinsing the photomask after the chemical washing can be remarkably reduced.

In addition, the washing time for removing foreign matter can be reduced due to the improved washing ability, and energy such as electricity can be saved. The chemical solution remaining after removing organic matter and metal impurities with the mixed solution of sulfuric acid and aqueous hydrogen peroxide is rinsed out with $H_2$ gas dissolved water mixed with an electrolyte such as ammonia. Re-adhering of grains floating in the rinsing solution to the surface of the photomask during rinsing is reduced as compared with the case of using high purity water for the rinsing, while the amount of the rinsing solution, the rinsing time and energy such as electricity can be further saved.

If the photomask to be used is a halftone photomask and a shading film formed thereon is an MoSiON film, foreign matter is removed by washing with $H_2$ gas dissolved water mixed with a small amount of ammonia of 0.003% concentration in the step 2, as shown in the second embodiment. When treating the photomask with such a chemical solution, a washing effect equivalent or superior to that in the prior art can be attained without varying the transmittance of the MoSiON film. If the ammonia concentration is not more than 1%, further, variation in the transmittance can be suppressed below the management criteria (e.g., 0.5%) and the washing efficiency can be improved by limiting the washing to a short time. The effect can be further improved when mega-ultrasonic waves are applied, as a matter course.

In a step 3, the washed photomask is dried to complete the process.

Through such a washing process, the efficiency for removing foreign matter adhering to the photomask is improved as compared with the prior art, whereby the treatment time can be reduced and the amount of high purity water and electrical energy can be saved. Further, the amount of the chemical solution used for washing can also be remarkably reduced.

Also when the shading film is an MoSiON film, the photomask can be effectively washed without varying the transmittance thereof.

Sixth Embodiment

With reference to a sixth embodiment of the present invention, an apparatus for washing a photomask for implementing the photomask washing methods according to the first to fifth embodiments is described.

Figure 7:
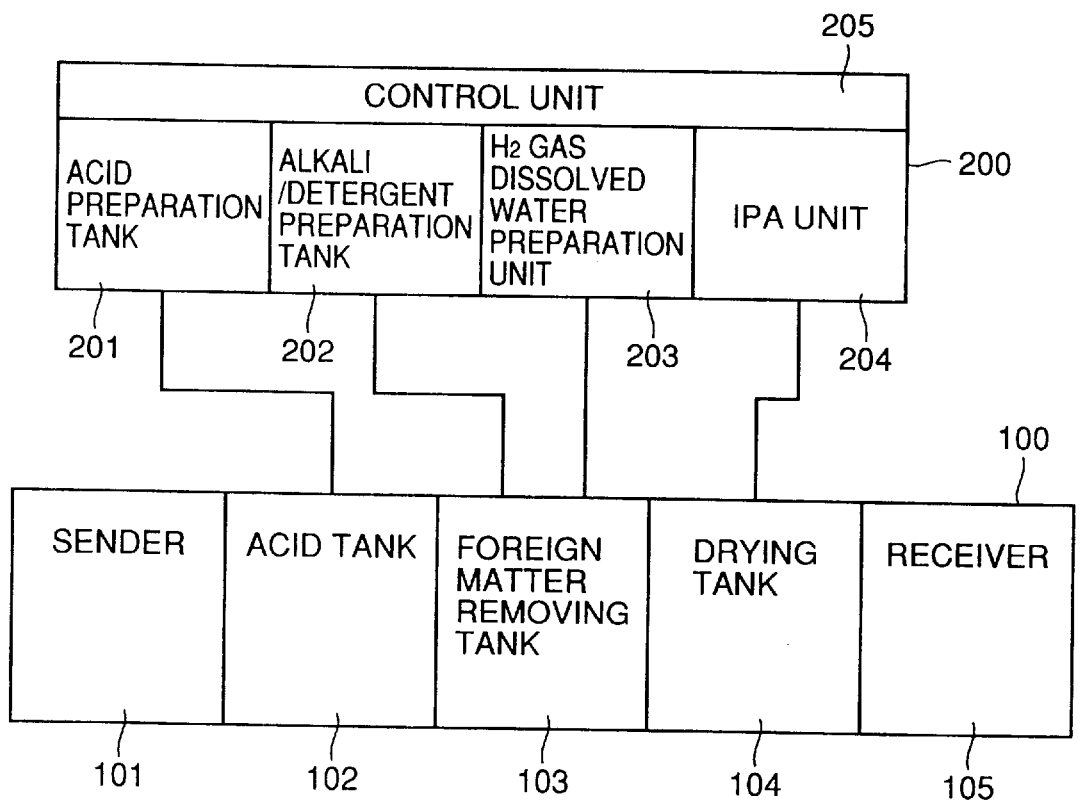
FIG. 7 is a conceptual diagram of a photomask washing apparatus.

FIG. 7 is a conceptual diagram showing a high-performance photomask washing apparatus according to the present invention. The washing apparatus is formed by an apparatus body 100 and a washing solution supply/control part 200 supplying a chemical solution or high purity water to each tank arranged on the apparatus body 100 while setting and controlling the same to prescribed concentration and temperature. The apparatus body 100 is formed by a sender unit 101, an acid tank 102, a foreign matter removing tank 103, a drying tank 104 and a receiver 105. The washing solution supply/control part 200 is formed by an acid preparation tank 201, an alkali/detergent preparation tank 202, an $H_2$ gas dissolved water forming unit 203, an IPA (isopropyl alcohol) unit 204 and a control unit 205.

Operations of the apparatus are now described with reference to FIG. 7.

Photomasks are set on the sender unit 101 of the apparatus body 100. At this time, a plurality of photomasks are set on the sender unit 101 one by one or at the same time. Each photomask set on the sender unit 101 is fed into the acid tank 102. In the acid tank 102, the photomask is subjected to acid treatment with sulfuric acid/aqueous hydrogen peroxide or the like supplied from the acid preparation tank 201. When the treatment in the acid tank 102 is completed, the photomask is then fed into the foreign matter removing tank 103. The foreign matter removing tank 103 is supplied with $H_2$ gas dissolved water formed in the $H_2$ gas dissolved water forming unit 203 and aqueous ammonia adjusted to a prescribed concentration in the alkali/detergent preparation tank 202 by the control unit 205. In the foreign matter removing tank 103, the photomask is subjected to mega-ultrasonic waves in the $H_2$ gas dissolved water, as described with reference to the first embodiment. Thus, particular foreign matter adhering to the surface of the photomask is effectively removed. Further, the efficiency for removing foreign matter grains adhering to the surface of the photomask can be remarkably improved by employing $H_2$ gas dissolved water mixed with a small amount of ammonia.

The concentration of the used ammonia in mixed with the $H_2$ gas dissolved water is about 0.003% when the pH of the $H_2$ gas dissolved water is 10. The washing effect can be improved with such extremely low concentration of ammonia, whereby the amount of the chemical solution used (ammonia) can be remarkably reduced. As compared with the case of using a concentrated chemical solution, further, the amount of high purity water used for rinsing the photomask after the chemical washing can be remarkably reduced. In addition, the washing time for removing foreign matter can be reduced due to the improved washing ability, and energy such as electricity can be saved.

When each of the acid tank 102 and the foreign matter removing tank 103 is formed as the overflow tank shown in FIG. 2, ultrasonics waves can also be applied for further improving the washing effect. Further, the amounts of the high purity water and the chemical solution can be saved and the number of foreign matter contained in the chemical solution can be controlled to a low level by overflowing and circulation-filtering the chemical solution stored in each tank.

Figure 8:
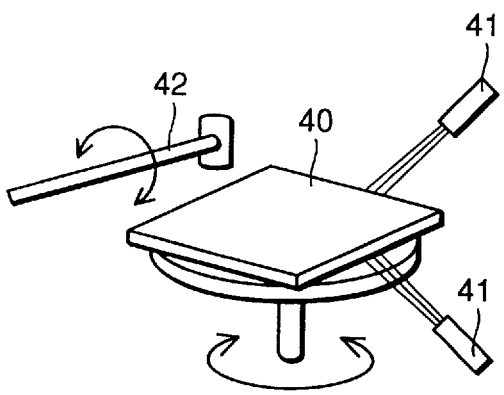
FIG. 8 is a conceptual diagram of a method of washing a photomask substrate horizontally rotating the photomask substrate.

FIG. 8 shows an exemplary method of applying $H_2$ gas dissolved water or aqueous ammonia of low concentration onto the surface of the photomask in each tank. As shown in FIG. 8, this method can be implemented by applying $H_2$ gas dissolved water or $H_2$ gas dissolved water mixed with a small amount of aqueous ammonia onto a surface of a horizontally rotated photomask substrate 40 from nozzles 41 fixed in a washing chamber (tank) or a nozzle fixed to a swinging arm 42. The nozzles 41 and the swinging arm 42 may be set in each of a plurality of tanks for dividing the washing path in response to the type of the treated photomask.

A unit for horizontally rotating the photomask and applying a chemical solution containing $H_2$ gas dissolved water, high purity water or the like onto the photomask from fixed nozzles or a nozzle fixed to a swingable arm can be set in the washing tank. With this unit, the photomask can be washed by brush scrubbing. Further, $H_2$ gas dissolved water or $H_2$ gas dissolved water mixed with a small amount of aqueous ammonia can be applied onto the mask from a swinging nozzle with application of mega-ultrasonic waves. Further, only high purity water subjected to mega-ultrasonics waves can be applied onto the photomask from such a mega-ultrasonic waves nozzle while applying aqueous ammonia, a mixed solution of aqueous ammonia and aqueous hydrogen peroxide, $H_2$ gas dissolved water, $H_2$ gas dissolved water mixed with a small amount of aqueous ammonia or the like from another nozzle for effectively removing foreign matter.

As a drying unit, a unit of steam drying with alcohol such as IPA, spin drying of rotating the photomask at a high speed in a horizontal state or the like is connected. Referring to FIG. 7, an IPA steam drying unit is set on the apparatus.

When setting a spin drying unit, the IPA unit 204 is removed from the washing solution supply/control part 200. The chemical solution used in each unit is supplied from a chemical solution supply unit (not shown) independent of the apparatus body 100. A control unit such as a sequencer for controlling the operations of the apparatus is set on the washing solution supply/control part 200. The dried photomask is fed into the receiver unit 105 and stored in a dedicated case or the like.

Seventh Embodiment

Figure 9:
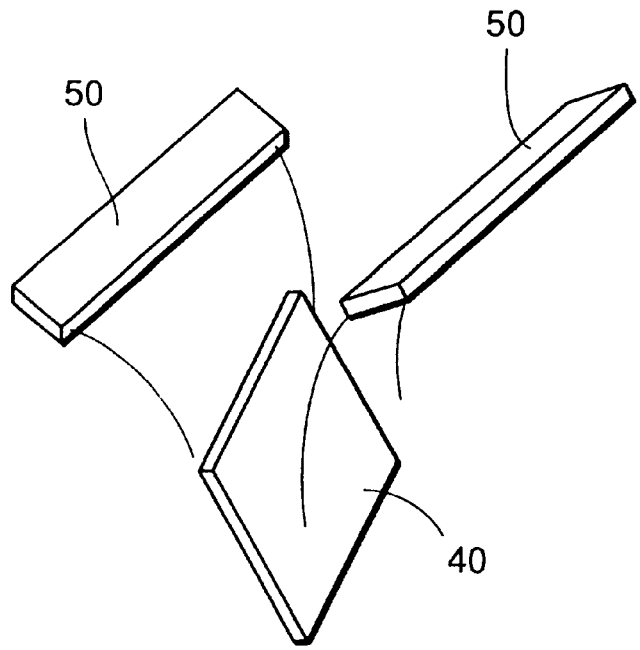
FIG. 9 is a conceptual diagram of a method of washing a photomask substrate employing a line-type megasonic nozzle.

The effects of the first to fourth embodiments can be attained by using general line-type mega-ultrasonic waves nozzles 50 and rinsing a photomask substrate 40 with megasonic irradiation in $H_2$ gas dissolved water or $H_2$ gas dissolved water mixed with a small amount of aqueous ammonia, as shown in FIG. 9.

Eighth Embodiment

Figure 10:
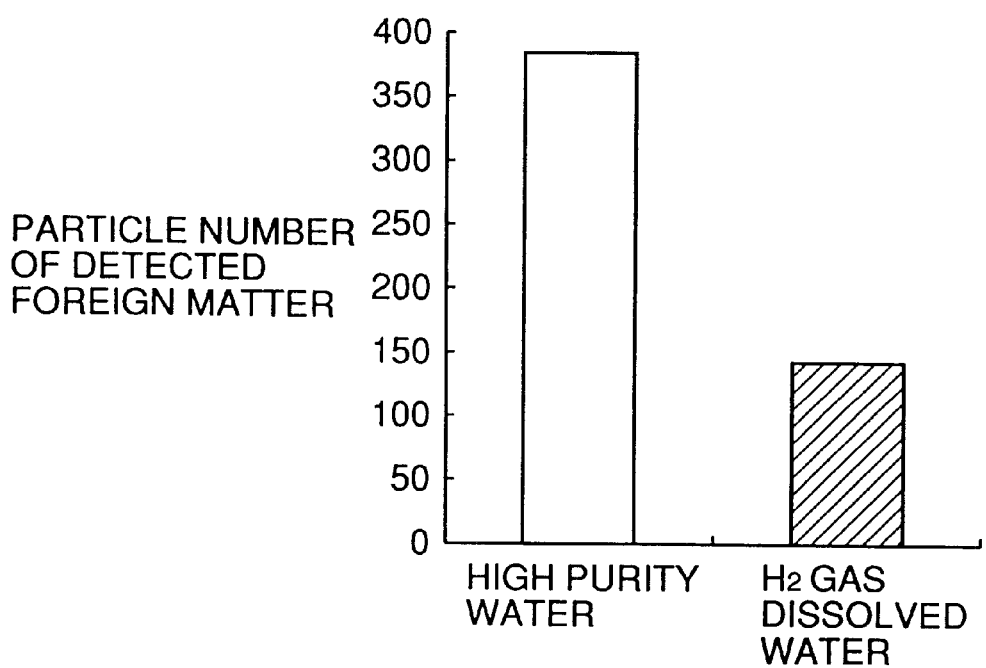
FIG. 10 is a graph showing the numbers of detected foreign matter remaining on a CrON film after resist removing treatment.

Foreign matter remaining on a CrON film after removing resist was detected. FIG. 10 shows the numbers of detected foreign matter. In the step of removing the resist from a photomask, the resist was removed by wet treatment with a chemical solution. FIG. 10 shows the number of foreign matter remaining on the photomask rinsed with high purity water and that of foreign matter remaining on the photomask rinsed with $H_2$ gas dissolved water in comparison with each other. The number of the remaining foreign matter was reduced to ¼ when the high purity water was replaced with the $H_2$ gas dissolved water. Thus, the number of remaining foreign matter can be reduced by employing $H_2$ gas dissolved water not only in the washing step but also in the resist removing step. Further, a similar effect can be attained by treating the photomask in $H_2$ gas dissolved water mixed with ammonia.

Ninth Embodiment

The effects of the first to fourth embodiments can be attained not only in relation to a photomask substrate formed with a pattern but also in application to wet treatment of a photomask blank for forming a photomask.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for washing a photomask comprising:
   an acid tank for removing organic matter and metal impurities present on the surface of a photomask with a first washing solution;
   a foreign matter removing tank for removing foreign matter adhering to said surface of said photomask with a second washing solution containing $H_2$ gas dissolved water;
   a drying tank for drying said photomask;
   first washing solution supply means supplying said first washing solution to said acid tank;
   first control means provided on said first washing solution supply means for controlling the concentration and the temperature of said first washing solution;
   second washing solution supply means supplying said second washing solution to said foreign matter removing tank; and
   second control means provided on said second washing solution supply means for controlling the concentration and the temperature of said second washing solution.

2. The apparatus for washing a photomask in accordance with claim 1, wherein said foreign matter removing tank is provided with ultrasonics waves application means for supplying ultrasonic waves into said foreign matter removing tank.

3. The apparatus for washing a photomask in accordance with claim 1, wherein said acid tank is provided with ultrasonics waves application means for supplying ultrasonic waves into said acid tank.

4. The apparatus for washing a photomask in accordance with claim 1, further comprising aqueous ammonia supply means provided in said foreign matter removing tank for supplying aqueous ammonia of prescribed concentration into said foreign matter removing tank.

* * * * *